Figure 1:
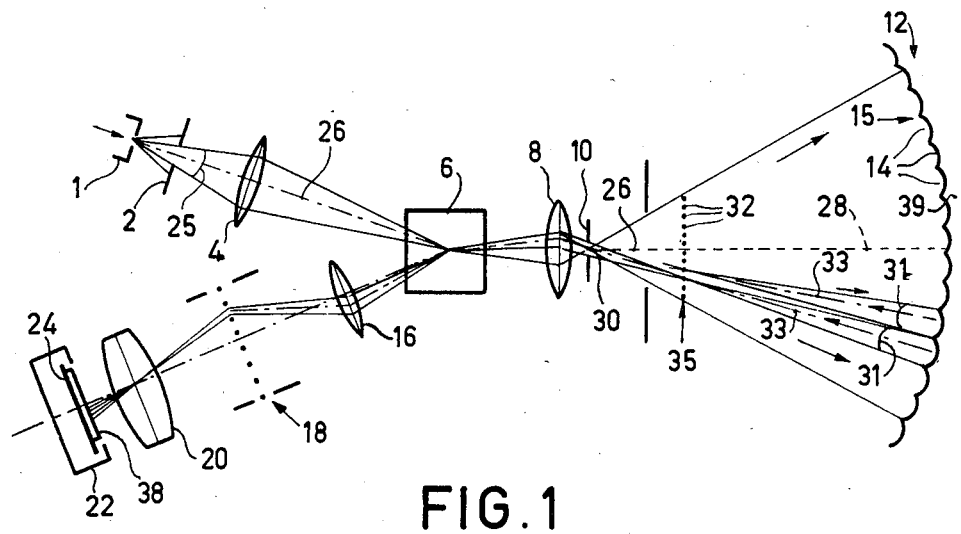

United States Patent [19]

Roelofs

[11] Patent Number: 4,568,833
[45] Date of Patent: Feb. 4, 1986

[54] CHARGED-PARTICLE BEAM EXPOSURE DEVICE INCORPORATING BEAM SPLITTING

[76] Inventor: Bernardus J. G. M. Roelofs, Laan van Overvest 1c, Delft, Netherlands

[21] Appl. No.: 740,308

[22] Filed: Jun. 3, 1985

Related U.S. Application Data

[63] Continuation of Ser. No. 468,227, Feb. 22, 1983.

[30] Foreign Application Priority Data

Apr. 7, 1982 [NL] Netherlands ............... 8201732

[51] Int. Cl.$^4$ .............. H01J 3/16; H01J 29/60; H01J 37/302; H01J 37/317
[52] U.S. Cl. .................. 250/398; 250/396 R; 250/492.2
[58] Field of Search .............. 250/492.2, 396, 398

[56] References Cited

U.S. PATENT DOCUMENTS 4,418,283 11/1983 Trotel .............. 250/492.2

FOREIGN PATENT DOCUMENTS 0028585 10/1980 European Pat. Off. .

Primary Examiner—Alfred E. Smith
Assistant Examiner—Jack I. Berman
Attorney, Agent, or Firm—Paul R. Miller

[57] ABSTRACT

For forming an array or series of elementary beams of charged particles, a beam exposure device includes a mirror system having a matrix of sub-mirrors. Using such a composite mirror, a multiple beam image is formed in a location which deviates from the position of the cross-over of principal rays of the elementary beams. Consequently, the elementary beams, which may alternatively be ion beams, can be separated modulated and controlled. For suitable imaging, such as the writing of patterns for a micro-electronic circuit element, the images and the cross-over of the principal rays of the elementary beams are combined. For this purpose, use is made of a second mirror whose sub-mirrors have an optical effect which opposes that of the first mirror.

16 Claims, 3 Drawing Figures

CHARGED-PARTICLE BEAM EXPOSURE DEVICE INCORPORATING BEAM SPLITTING

This application is a continuation application of Ser. No. 468,227, filed Feb. 22, 1983, and all benefits of such application are hereby claimed.

The invention relates to a device for and a method of exposing a target plate to be positioned in an object space to a beam of charged particles with the device comprising a radiation source and a beam splitting-/modulation device for the formation and control of a matrix of elementary beams of charged particles.

A device of this kind is known from U.S. Pat. No. 3,491,236. Using a beam splitting device which is arranged near a target to be exposed, several areas on the target can be exposed by the electron beam writing apparatus described therein without displacement of the target being required. The accuracy of the orientation of the patterns to be written with respect to one another is thus enhanced. By utilizing an electron beam having a large cross-section at the area of the beam splitting device, the apparatus can also operate with several elementary beams simultaneously in an identical manner, so that the operating speed is increased.

When a single scanning beam is used in the described apparatus, the operating speed will be too low for many applications. When use is made of several elementary beams derived from a fan-shaped beam, of course, only identical patterns can be written thereby; this represents a restriction in many applications. Often the mutual homogeneity of the elementary beams thus formed is insufficient for the manufacture of sufficiently identical products. Improvement of the necessary homogeneity of the local current density distribution of the fan-shaped beam, for example, by utilizing a wider beam with a larger total current, causes a life-reducing increased loading of the beam splitting device by the beam particles intercepted thereby, as well as an increased source cathode load. Moreover, in a beam of this kind the energy spread of the particles is increased and this is extremely detrimental to the accuracy of the apparatus.

The invention has for its object to provide a device in which these drawbacks are avoided or at least substantially mitigated. To this end, a charged-particle beam exposure device of the kind set forth in accordance with the invention is characterized in that the beam splitting-/modulation device comprises a mirror system, a reflection surface of which is provided with a matrix of sub-mirrors, each of the sub-mirrors being constructed as an optical element for charged particles.

In a device in accordance with the invention, a composite mirror system acts as an elementary beam forming element for the beam of charged particles. Using the mirror system, a multiple image of the source can be formed which does not coincide with a cross-over of the principal rays of the elementary beams; this is an extremely attractive configuration for a multi-beam system.

It is to be noted that a device for the manufacture of chips which comprises a mirror is known per se from European Patent Application EP 00 28 585. In a device described therein, an electron beam is projected onto a target to be exposed from an electron mirror which comprises a matrix of electrodes whereby an incident beam of electrons can be locally influenced. Thus, a pattern can be formed in the cross-section of the beam. Such a pattern is then imparted to the electrodes in the form of a potential distribution by a control unit. The mirror is then preferably constructed to be flat and the incident electron beam is directed transversely thereof. The cross-section of the incident electron beam is determined by means of apertures. For many applications this device is not flexible enough and, moreover, the scatter produced in the mirror is very problematic. The additional aperture included for this purpose is only capable of eliminating the scatter occurring outside the beam circumference and not the scatter which occurs within the matrix of elementary beams, so that the disturbing cross-talk between image element cannot be avoided to a sufficient degree. It is another substantial drawback of this method that the reflective surface is imaged as such on a target to be exposed, so that all optical irregularities of the mirror are also transferred to the target as disturbing elements.

A preferred embodiment in accordance with the invention comprises an aperture which determines an elementary beam cross-section and which is arranged in a radiation center of the mirror. When the principal mirror is homogeneously exposed from the radiation center, each of the elementary mirrors forms, after reflection, an image of the radiation center and hence of the source. This image is no longer coincident with the cross-over of the principal rays of the elementary beams and constantly remains in the radiation center. The separation between source image and cross-over of the principal rays which is required for the manipulation of the elementary beams is thus achieved and the cross-section of each elementary beam is determined by a single aperture. Because substantially the entire beam system is effectively used thanks to the mirror system, the source load remains limited. Because a single aperture acts as elementary beam limiter, no insurmountable heating and pulverising problems occur, so that electron beams as well as ion beams can be used.

The aperture in a further preferred embodiment is shaped as a character template, so that all elementary beams have a fully identical cross-section which, however, can be chosen as desired. A number of patterns which corresponds, for example, to the number of elementary beams can thus be extremely quickly exposed; moreover, the patterns are automatically identical.

By utilizing, for example, another mirror system, an excitable gauze optical system, a so-called fly's eye optical system, the cross-over of the principal rays of the elementary beams, and the multiple source image can be recombined again in a further embodiment.

Because use is made of a mirror for at least the beam splitting, a device in accordance with the invention offers the practical advantages that correction for spherical and chromatic aberration is simple, so that large angles of aperture are permissible for the overall beam. Moreover, each of the elementary separate beams can thus also be readily manipulated. This is because the entire rear side of the mirror is available for signal supply leads. Because only the reflective surface of the mirror is effective from an optical point of view, the construction of this element may be very robust, so that the stability of the device is enhanced. Because no gauzes are used for beam splitting, no problems are experienced due to pulverizing; such problems could otherwise become very serious when use is made of ion beams. Because the reflection of the mirror may be high, even almost as high at 100%, a very efficient use can be made of the beam; this benefits the load, notably the cathode load.

The device is also extremely simple from an optical point of view, because even the embodiment for individual multi-beam modulation with an aperture actually comprises only three charged-particle optical elements for the multiple spotshaping, that is to say the subdivided mirror, the aperture arranged in the center of curvature, and the system for combining the source images.

A preferred embodiment of the reflective system, being a very essential part of the device, is shaped as a concave mirror in which the elementary mirrors are formed as cavities having a radius of curvature which deviates from that of the principal mirror. The elementary mirrors are preferably situated quite near to one another in an orthogonal matrix. The elementary mirrors may alternatively be formed as activatable electrodes provided in or near the reflective surface. If desired, on-off control and deflection of the elementary beams can also be achieved by means of such electrodes.

A charged-particle beam exposure device in accordance with the invention is particularly suitable for use in an apparatus for electron or ion lithography, as a multiple source for television systems where, for example, use could also be made of a single row of elementary beams, for example, transversely of the line direction of the scan and, for example, for electron optical display systems with rapid character writing.

Figure 2:
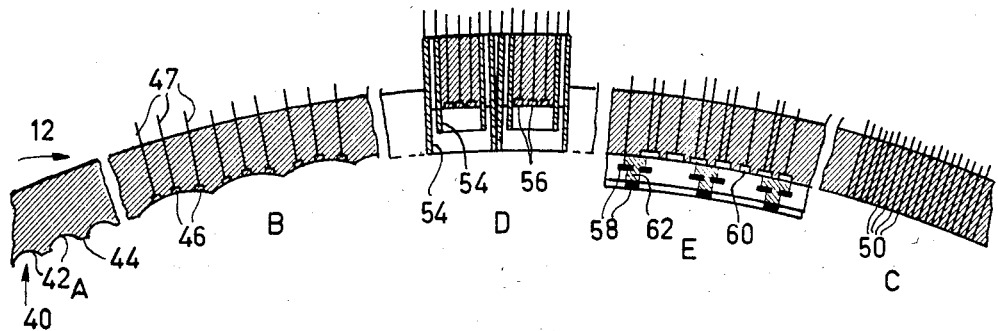
Figure 3:
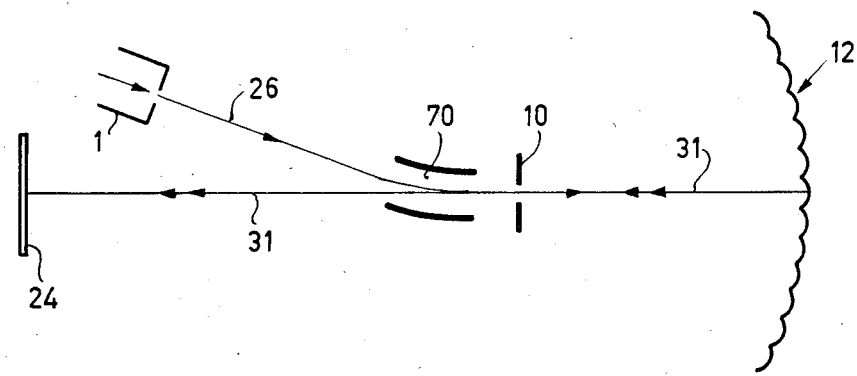

Some preferred embodiments in accordance with the invention will be described in detail hereinafter with reference to the drawing. Therein:

FIG. 1 diagrammatically shows a charged-particle beam exposure device in accordance with the invention, FIG. 2 shows various embodiments of a mirror system comprising a matrix of elementary mirrors for such a device, and FIG. 3 diagrammatically shows a charged-particle beam exposure device in accordance with the invention which comprises a deflection element in the form of a high-frequency prism.

The device shown in FIG. 1 comprises a radiation source 1 which may be an electron source or an ion source. For the sake of simplicity, the device will be described hereinafter as an electron-optical device. The device also comprises an aperture 2, a first lens 4, a beam deflection device 6, a second lens 8, a second aperture 10, an electron-optical mirror 12 which has a reflective surface 15 with a matrix of elementary mirrors 14, a third lens 16, a gauze optical system 18 to be energized, a reducing lens system 20 and a target carrier 24 which is arranged in an object space 22.

In the beam deflection device 6 a central portion 25 of an electron beam emerging from the source is deflected towards the mirror so that a principal ray 26 thereof coincides with an axis 28 of the mirror. The mirror 12 is in principle homogeneously exposed by the electron beam from an optical center of curvature 30. In the case of a single mirror, the reflected beam would be focused in the optical center of curvature 30 again. The mirror comprises a matrix of sub-mirrors 14, each of which acts as an optical element. The incident homogeneous beam 25 is subdivided thereby into a number of elementary beams 31 which is given by the number of matrix elements within the beam cross-section. Principal rays 33 of the elementary beams 31 intersect one another again in the optical center of curvature 30 but, thanks to the optical effect of the mirror elements 14, each of the elementary beams 31 forms a cross-over 32 and hence an image of the source in an image plane 35. This image can be optimized by control of the elementary mirrors. Thus, in the image plane there is formed a matrix of mutually separated images but, when use is made of mutually identical mirror elements and a homogeneous incident beam, mutually equal object points for further imaging of the elementary beams. All elementary beams pass through the aperture 10 arranged in the plane of the optical center of curvature. This aperture is also capable of influencing the beam cross-section per elementary beam, be it to the same extent for each beam. In conjunction with the beam aperture 2, beam-shaping can be performed, if desired, for each of the elementary beams by the imaging, of the aperture 2 on the aperture 10; for this only partial overlapping may also occur.

The combined elementary beams are collimated by the lens 8 in order to be applied to the beam deflection device 6 in which they are deflected to the target carrier 24 without disturbing defects, which is also thanks to the collimation. Using the lens 16 and the reducing lens system 20, each of the elementary beams is capable of imaging the aperture 10 on a target 38 to be positioned on the target carrier 24. When beam shaping is not desired, the aperture 2 may be omitted. An energisable gauze optical system 18 combines the cross-over of the principal rays of the elementary beams again with the multiple source image. An image of the aperture 10 is then automatically separated in space in each of the elementary beams and the cross-over of the principal rays of each of the elementary beams again coincides with an image of the source for the exposure of the target. Instead of using the energizable gauze optical system 18 for this combination operation, use can alternatively be made of a second mirror comprising a matrix of sub-mirrors which is adapted to that of the first mirror. With respect to the operation of the second mirror here, the effect of the sub-mirrors as such is to diverge the elementary beams. However, this aspect of the two mirrors can be interchanged, the mirror 12 then comprising diverging sub-mirrors. A mirror of this kind can also be used in the absence of a second mirror. Use can then be made of a further beam deflection device, but for the deflection use can also be made of the deflection device 6. Beam deflection can also be achieved by arranging the mirror at an angle with respect to the incident beam. Such an arrangement at an angle may also be chosen or the first mirror. When a 1:1 image is formed, the only optical error will be astigmatism for which a mirror can be corrected in known manner. For the beam deflection device use can be made of a homogeneous magnetic field which is directed transversely of the deflection direction or of a high-frequency electrostatic prism which will be described in detail with reference to FIG. 3.

For the combining of the cross-over of the principal rays of the elementary beams and the source image, use can alternatively be made of an electron-optical device which is known as a fly's eye and which is described in U.S. Pat. No. 3,491,236. Using the reducing lens optical system 20, each of the elementary beams is reduced, for example, by a factor 10 and imaged on the target. When a character template is arranged at the area of the aperture 10, a random fully identical cross-section can be imposed on each of the elementary beams. After deflection, combination and reduction, a matrix of elementary beams thus formed can be used for example, to write a pattern directly onto a target. This is notably important when a large number of identical patterns must be written; this often occurs in the manufacture of microelectronic circuit elements.

The major advantage of the use of a mirror for the beam splitting device is that the elementary beams can be suitably separated in space without giving rise to disturbing optical defects. As appears from FIG. 1, it is extremely advantageous that an optically "free" space 39 is available behind the mirror for supply leads for control signals.

FIG. 2 diagrammatically shows some preferred embodiments of a mirror in accordance with the invention.

A first part A of FIG. 2 shows a mirror having a reflective surface 40 which corresponds to the surface 15 of FIG. 1 with, for example, a radius of curvature of 100 mm, and which is provided with a matrix of sub-mirrors 42 having a radius of curvature of, for example, 50 mm. The sub-mirrors are accommodated, for example, in an orthogonal matrix of 10×10 elements with a diameter of 5 mm and a spacing 44 of, for example, 6 mm. Measured on the mirror surface, the sub-mirrors may form, for example, squares. For the elimination of edge defects, it may be advantageous to round off the corners of the square slightly. In this simplest form a matrix of spatially separated elementary beams can be obtained by means of the mirror. For any manipulation, switching and beam shaping other known means must be included in the device.

In a part B of FIG. 2, switching or deflection electrodes 46 are provided in a mirror which otherwise fully conforms to the mirror shown in part A. These electrodes are shaped as plates which are disposed on supply leads 47 and which are electrically insulated with respect to the mirror, an outer surface of the plates being flush with the surface of the mirror of part A. Using electrodes of different potential, the optical effect of the sub-mirrors as such can also be achieved; in that case the original geometrical sub-mirrors may be omitted. Also feasible are intermediate solutions which offer optimally operating sub-mirrors by adaptation of the geometrical shape of the sub-mirrors and the number, the shape, the orientation and the potential of the electrodes. In that case it is necessary, however, to provide a comparative large number of electrodes per sub-mirror. Such an embodiment is shown in part C of FIG. 2. The concave mirror, being single as far as its shape is concerned, now comprises a large number of, for example, from 10 to 20 wire electrodes 50 per sub-mirror which are now simply formed by electrically conductive wires, an end face of which is flush with the mirror surface but which are electrically insulated from the mirror as such. Also feasible would be a fiber structure of conductors in an insulating body. In a homogeneous resistance layer on the reflective surface, for example, a vapour-deposited carbon layer, or in a layer of semiconductor material (for example, a Si layer having a thickness of some tens of $\mu$m), the sub-mirrors can also be formed, that is to say by a matrix of electrodes which are in contact therewith at the rear side. Electrodes, such as the electrode 47, which do not extend as far as the reflective surface can then serve as electrodes for this solution. Each electrode is preferably enclosed by a conductive bush, with the bushes together forming a closed matrix, for example, a honeycomb. An individual potential may be applied to each of the electrodes, but it will usually be attractive for the potential connection to combine the electrodes group-wise per sub-mirror and also to combine electrodes of corresponding sub-mirrors. For each sub-mirror use can be made of a group configuration which corresponds to the geometry of the sub-mirror.

Part D of FIG. 2 shows an embodiment in which the sub-mirrors are formed, for example, by rectangular cylindrical electrodes 54 which project from the mirror surface. Inside each of these cylinders modulation or switching electrodes 56 may be provided. The surface of the sub-mirrors may be flat, but it may also exhibit an additional curvature. Part E shows an embodiment in which the mirrors are formed by grid electrodes 58 which are arranged to be mutually insulated and insulated from the mirror as such; again different potentials can be applied to the electrodes for modulation, switching etc. Again separate control electrodes 60 may be provided. The electrodes 58 are shown as being connected to the mirror by way of an insulator 62. The electrodes which are situated at the same distance from the mirror surface, however, may also be formed by a mask which is supported only at the edge of the mirror in an insulating manner. The potential is adapted mainly to the potential which would prevail at this area in the absence of the electrodes.

FIG. 3 shows an embodiment in which a high frequency electrostatic prism 70 is used as the beam deflection device. From the device only the source 1 which may be, for example, a He$^+$ ion source in this case, the aperture 10, the matrix mirror 12 and the target carrier 24 are shown. The advantage of this embodiment is that the imaging or writing beam 31 is now unbended from its origin, i.e. the mirror 12. Thus, optical faults are reduced and the positioning of the optical components is simpler. The prism is in principle controlled in a pulsed manner, an incoming beam 26 being deflected towards the mirror during a pulse while the writing beam can simply pass during the absence of a pulse. Using such a prism, ion selection can also be realized on the basis of the difference in mass. The active pulse may in principle amount to approximately half the repetition frequency; during this period, no active beam is present. This time can be used for the optical shifting of the landing spot on the target. By a suitable choice of a source, it can also be controlled by the pulse, so that the total current of the source can be reduced in proportion. The switching-on and off of the elementary beams can also be controlled by the pulse frequency for the prism. For He$^+$ ions use can be made of a repetition frequency of approximately 1 MHz with customary dimensions of the device.

Even though the charged-particle beam exposure device has been described mainly with reference to an apparatus for lithography by utilizing a beam of charged particles, the field of application is much wider. For example, the device can also be used, even in its simplest form, for television systems with simultaneous writing by means of several beams. This may be advantageous notably when the normal frame frequency is experienced as been too low when several image sections are to be treated in a different manner and also in the case of high local instantaneous loads of the display screen. Extremely favourable results can be obtained in multi-beam oscilloscope tubes and, as has already been noted, in suitable display devices.

Should the beam of charged particles 26 strike the mirror 12 insufficiently homogeneously, which could occur, for example, in the case of a square matrix of sub-mirrors to be struck, the homogeneity can be enhanced by the scanning of the beam at the source side in a pattern adapted to the matrix, for example, between four positions for the square matrix. In order to prevent imaging faults, this scanning operation is preferably performed as a tilting about the point 30 in the aperture 10.

For the exposure of a composite pattern with a beam exposure device of the present type, it may be advantageous to replace the system for the imaging of two apertures on one another in order to perform beam shaping by a beam splitting device as disclosed in Netherlands Patent Application No. 8200559, filed Feb. 15, 1982, corresponding to U.S. patent application Ser. No. 465,937, filed Feb. 14, 1983, and assigned to the same assignee.

What is claimed is:

1. A device for exposing a target to be positioned in an object space to a beam of charged particles, said device comprising
   a radiation source forming a radiation beam,
   beam splitting/modulation means for forming and controlling a matrix of elementary beams of charged particles of said radiation beam, said beam splitting/modulation means including
   beam deviating means for passing said radiation beam to a reflective structure, and thereafter passing said matrix of elementary beams to a target,
   mirror means for receiving said radiation beam and reflecting said matrix of said elementary beams to said target, said mirror means including
   a curved reflective surface having a matrix of sub-mirrors, each of said sub-mirrors being a charged particle optical element for forming one elementary beam, and
   target means providing said target for receiving said elementary beams.

2. A device according to claim 1, wherein said sub-mirrors have a geometrical radius of curvature, said geometrical radius of curvature for said sub-mirrors deviating from a geometrical radius of curvature for said reflective surface.

3. A device according to claim 1 or 2, wherein said sub-mirrors include a system of electrodes, said electrodes being provided at said reflective surface, and said electrodes being activated separately or group-wise.

4. A device according to claim 3, wherein at least a portion of said electrodes is constructed as cylindrical bushes, said cylindrical bushes forming said sub-mirrors, and said cylindrical bushes projecting from said reflective surface.

5. A device according to claim 1, wherein said reflective surface includes a homogeneous layer of moderately conductive material, said sub-mirrors having a potential distribution generated by electrode assemblies contacting a rear surface thereof.

6. A device according to claim 1, 2 or 5, wherein said sub-mirrors form an orthogonal matrix.

7. A device according to claim 1, 2, or 5, wherein said sub-mirrors have a cross-section measured on said reflective surface and substantially forming a square.

8. A device according to claim 1, 2, or 5, wherein an aperture forming structure for determining an elementary beam cross-section is situated adjacent an optical center of curvature of said mirror means.

9. A device according to claim 8, wherein a radiation source aperture structure is provided near said radiation source, said radiation source aperture structure having an aperture imaged in a plane of an aperture of said aperture forming structure.

10. A device according to claim 8, wherein means for optically combining source images of said elementary beams is provided between said mirror means and said aperture forming structure.

11. A device according to claim 1, 2, or 5, wherein said beam deviating means includes a high-frequency electrostatic prism.

12. A device according to claim 1, 2, or 5, wherein said target means includes an object carrier, and wherein a reducing optical system is provided near said object carrier.

13. A device according to claim 1, 2, or 5, wherein said beam splitting/modulation means includes a charged-particle system for controlling and modulating each of said elementary beams.

14. A device according to claim 1, 2, or 5, wherein a multiple beam splitting means is provided for exposing a composite pattern.

15. A device according to claim 1, 2, or 5, wherein micro-electronic components are formed by said devices.

16. A device according to claim 15, wherein said device includes an ion source, and wherein optical elements are adapted thereto.

* * * * *